(12) United States Patent
Noh et al.

(10) Patent No.: US 7,560,974 B2
(45) Date of Patent: Jul. 14, 2009

(54) GENERATION OF BACK-BIAS VOLTAGE WITH HIGH TEMPERATURE SENSITIVITY

(75) Inventors: Kyong-Jun Noh, Suwon-Si (KR); Gyu-Hong Kim, Yongin-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 56 days.

(21) Appl. No.: 11/506,035

(22) Filed: Aug. 17, 2006

(65) Prior Publication Data

US 2007/0047333 A1    Mar. 1, 2007

(30) Foreign Application Priority Data

Aug. 26, 2005    (KR) .................. 10-2005-0078583

(51) Int. Cl.
*H03K 5/153*    (2006.01)
*H03K 3/01*    (2006.01)
*H01L 35/00*    (2006.01)
*G05F 1/10*    (2006.01)

(52) U.S. Cl. .................. 327/534; 327/77; 327/513; 327/536

(58) Field of Classification Search ............. 327/333, 327/83, 534, 537; 331/74; 365/222
See application file for complete search history.

(56) References Cited

U.S. PATENT DOCUMENTS

| 4,849,661 | A | * | 7/1989 | Bazes | .......................... 326/71 |
|---|---|---|---|---|---|
| 5,157,278 | A | | 10/1992 | Min et al. | ................. 307/296.2 |
| 5,483,205 | A | * | 1/1996 | Kawamura | .................... 331/74 |
| 5,544,120 | A | * | 8/1996 | Kuwagata et al. | ............ 365/222 |
| 2003/0102901 | A1 | * | 6/2003 | Ooishi | ......................... 327/512 |

OTHER PUBLICATIONS

Korean Patent Application No. 1020000014505 to Tomohiro et al., having Publication date of Dec. 26, 2000 (w/ English Abstract page).
Japanese Patent Application No. 10-322602 to Tsugio, having Publication date of May 30, 2000 (w/ English Abstract page).
Japanese Patent Application No. 10-338284 to Kenichi et al., having Publication date of Jun. 16, 2000 (w/ English Abstract page).
Korean Patent Application No. 1020010009447 to Choi, having Publication date of Aug. 30, 2002 (w/ English Abstract page).

* cited by examiner

*Primary Examiner*—Quan Tra
*Assistant Examiner*—Colleen O'Toole
(74) *Attorney, Agent, or Firm*—Monica H. Choi

(57) ABSTRACT

A level detector within a back-bias voltage generator includes a toggling unit and a temperature detector. The toggling unit causes an enable signal to be activated when an absolute value of a back-bias voltage is less than an absolute value of a monitoring level. The temperature detector controls the toggling unit for increasing the absolute value of the monitoring level with an increase in temperature with high temperature sensitivity.

15 Claims, 5 Drawing Sheets

GENERATION OF BACK-BIAS VOLTAGE WITH HIGH TEMPERATURE SENSITIVITY

BACKGROUND OF THE INVENTION

This application claims priority under 35 USC §119 to Korean Patent Application No. 2005-78583, filed on Aug. 26, 2005 in the Korean Intellectual Property Office, the disclosure of which is incorporated herein in its entirety by reference.

1. Field of the Invention

The present invention relates generally to generating a back-bias voltage, and more particularly, to generating a back-bias voltage with high temperature sensitivity for compensating characteristics of a semiconductor memory device that vary with temperature.

2. Description of the Related Art

In general, a semiconductor memory device, particularly a DRAM (dynamic random access memory) device, applies a back-bias voltage (VBB) to p-type wells. Such P-type wells each have formed therein an NMOS (N-channel metal oxide semiconductor) transistor as a cell transistor of the DRAM device.

The applied VBB may improve a refresh characteristic of the DRAM device by increasing a threshold voltage of the cell transistor (consequently decreasing a leakage current). In addition, the applied VBB may stabilize circuit operation by decreasing a change of the threshold voltage of the cell transistor.

FIG. 1 shows a block diagram of a conventional back-bias voltage (VBB) generating circuit. Referring to FIG. 1, the conventional VBB generating circuit includes a VBB detector circuit 10, an oscillator 20, and a charge pumping circuit 30. The VBB detector 10 detects a level of the VBB voltage generated by the charge pumping circuit 30. The VBB detector 10 generates an enable signal EN that is provided to the oscillator 20.

The enable signal EN is activated to a logic high state from a logic low state by the VBB detector when the absolute value of the VBB voltage is less than a monitoring level, and deactivates the enable signal EN other-wise. The oscillator 20 generates an oscillating signal OS when the enable signal EN is activated. The charging pumping circuit 30 pumps charge to a substrate (i.e., a P-well for example) of the memory device in response to the generated oscillating signal OS.

FIG. 2 shows a circuit diagram of the conventional VBB detector 10 in the VBB generating circuit of FIG. 1. Referring to FIG. 2, the conventional VBB detector 10 includes a voltage divider 12, a first CMOS inverter 14, and a second COMS inverter 16.

The voltage divider 12 outputs a divided voltage having a level that is divided by a ratio of a turn-on resistance of a first PMOS (P-channel metal oxide semiconductor) transistor PM11 to a turn-on resistance of a second PMOS transistor PM12. The turn-on resistance of the first PMOS transistor PM11 is substantially constant since a gate of the first PMOS transistor PM11 is coupled to ground. On the other hand, the turn-on resistance of the second PMOS transistor PM12 varies depending upon the voltage level of VBB that is applied to a gate of the second PMOS transistor PM12.

Thus, the divided voltage Vdiv from the voltage divider 12 varies with the change of the turn-on resistance of the second PMOS transistor PM12. The level change of the divided voltage Vdiv is detected by the first CMOS inverter 14 for being converted into a pulse signal having a variable pulse width. The pulse signal from the first CMOS inverter 14 is converted to the enable signal EN having a full CMOS level by the second inverter 16. The enable signal EN output from the second inverter 16 is applied to the oscillator 20.

The oscillator 20 is enabled to generate an oscillating signal OS when the enable signal EN is activated. The charge pumping circuit 30 pumps charge to a substrate in response to the generated oscillating signal OS to increase the absolute value of VBB. When the absolute value of VBB is no longer less than the absolute value of the monitoring level, the enable signal EN from the detecting circuit 10 is deactivated from the logic high state to the logic low state. Accordingly, the oscillator 20 and the charge pumping circuit 30 are disabled in response to the deactivated enable signal EN. The VBB level is constantly monitored in this manner such that the VBB level is maintained within a predetermined range.

FIG. 3 shows waveforms of the enable signal EN generated by the conventional VBB detector according to temperature variation. Referring to FIG. 3, the absolute value of the monitoring level of the conventional VBB detector 10 is decreased with the temperature. In addition, such a change of the monitoring level is very insignificant.

Accordingly, the boosting margin characteristic of a word line driving voltage for the DRAM memory device remains deteriorated at low temperatures. In addition, the refresh characteristic for the DRAM memory device remains deteriorated at high temperatures.

SUMMARY OF THE INVENTION

Accordingly, a back-bias voltage (VBB) generator has a VBB level detector with a monitoring level that is highly sensitive to temperature. In addition, the absolute value of the monitoring level is increased with temperature for improving operation of the memory device at low and high temperatures.

A level detector within a back-bias voltage generator according to an aspect of the present invention includes a toggling unit and a temperature detector. The toggling unit causes an enable signal to be activated when an absolute value of a back-bias voltage is less than an absolute value of a monitoring level. The temperature detector controls the toggling unit for increasing the absolute value of the monitoring level with an increase in temperature.

In an example embodiment of the present invention, the temperature detector includes a diode-connected transistor, a resistor, and a turned-on transistor. The turned-on transistor is coupled in series with the resistor at a control node generating a control bias voltage that increases with the temperature. In addition, the diode-connected transistor is coupled in series with the resistor.

The threshold voltage of the diode-connected transistor decreases with the temperature, and the turn-on resistance of the turned-on field effect transistor increases with the temperature. In that case, the control node is coupled to the toggling unit such that the control bias voltage determines the absolute value of the monitoring level.

In another example embodiment of the present invention, the toggling unit includes an inverter with P-channel and N-channel transistors having drains coupled together to generate a pre-enable signal. In addition, the toggling unit further includes pull-up and pull-down transistors. The pull-up transistor is coupled between a high voltage supply and the P-channel transistor. The pull-down transistor is coupled between a low voltage supply and the N-channel transistor. The control bias voltage is applied on gates of the pull-up and pull-down transistors.

In a further example embodiment of the present invention, the level detector further includes another inverter for inputting the pre-enable signal from the inverter of the toggling unit to generate the enable signal.

In another example embodiment of the present invention, the level detector also includes a voltage divider for generating a divided voltage that varies with the back-bias voltage. The divided voltage is input by the inverter of the toggling unit. In an example embodiment of the present invention, the voltage divider includes first and second P-channel field effect transistors. The first P-channel field effect transistor has a source coupled to a high voltage supply and has a gate coupled to a ground node. The second P-channel field effect transistor has a source coupled to a low voltage supply and has a gate with the back-bias voltage applied thereon. The drains of the first and second P-channel field effect transistors are coupled together to generate the divided voltage.

The level detector may be used to particular advantage in the back-bias voltage generator having an oscillator and a charge pump. The oscillator generates an oscillating signal when the enable signal is activated. The charge pump pumps charge in response to the oscillating signal to increase an absolute value of the back-bias voltage.

In this manner, the temperature detector includes two field effect transistors with characteristics that vary with temperature. Thus, the absolute value of the monitoring level in the level detector varies with high sensitivity to temperature. In addition, the absolute value of the monitoring level is increased with higher temperature such that the absolute value of the back-bias voltage is increased with higher temperature.

Such a higher absolute value of the back-bias voltage at high temperatures enhances the refresh characteristics of the DRAM memory device. The lower absolute value of the back-bias voltage enhances the boosting margin of a word line driving voltage for a DRAM memory device at low temperatures.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, and 8 refer to elements having similar structure and/or function.

DETAILED DESCRIPTION OF THE INVENTION

Figure 1:
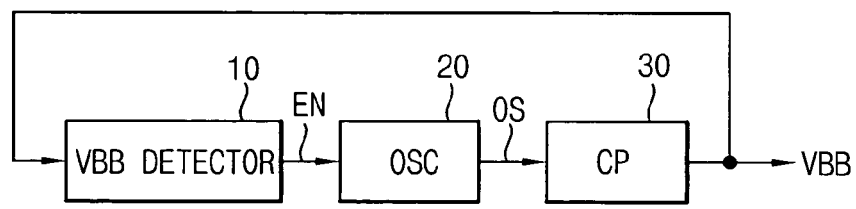
FIG. 1 shows a block diagram of a conventional back-bias voltage generating circuit.
Figure 2:
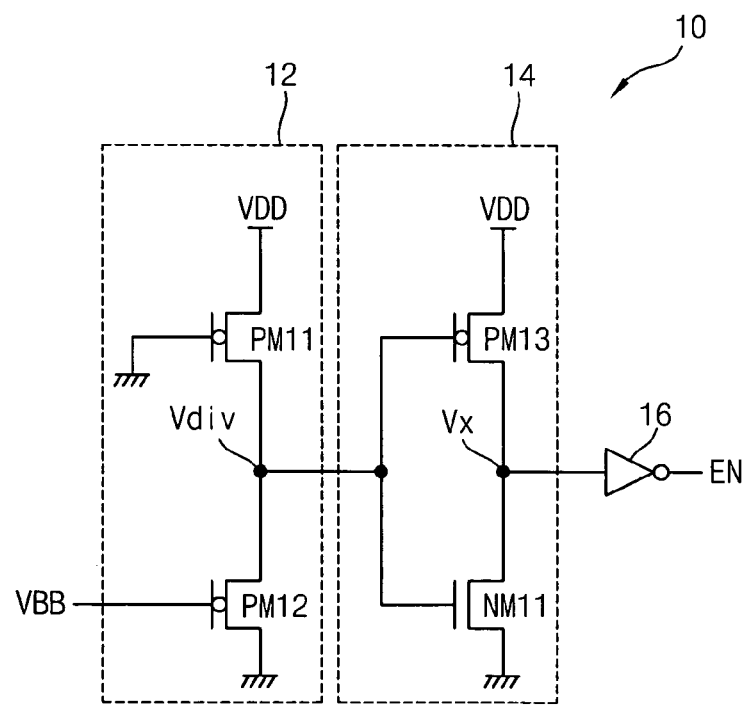
FIG. 2 shows a circuit diagram of a conventional VBB detector in the VBB generating circuit of FIG. 1.
Figure 3:
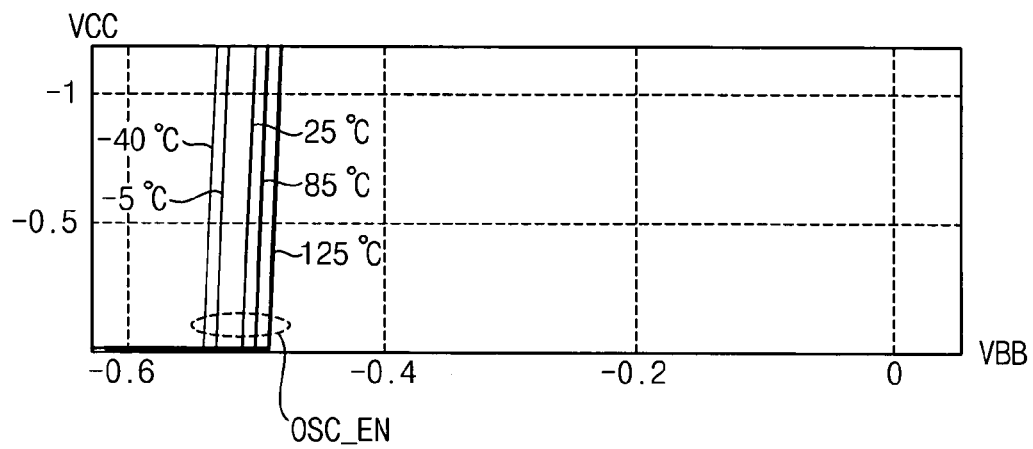
FIG. 3 illustrates waveforms of an enable signal at various temperatures as generated by the conventional VBB detector of FIG. 2.
Figure 4:
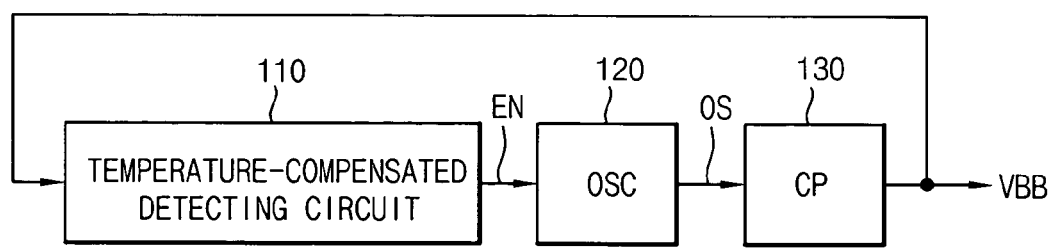
FIG. 4 shows a block diagram of a back-bias voltage generator, according to an example embodiment of the present invention.

FIG. 4 shows a block diagram of a back-bias voltage (VBB) generator 100 according to an example embodiment of the present invention. Referring to FIG. 4, the VBB generator 100 includes a temperature-compensated detecting circuit (i.e., a temperature-compensated level detector) 110, an oscillator 120, and a charge pump 130.

The temperature-compensated level detector 110 generates an enable signal EN from a back-bias voltage (VBB) as generated by the charge pump 130. The oscillator 120 generates an oscillating signal OS when the enable signal EN is activated. The oscillator 120 is disabled and does not generate the oscillating signal OS when the enable signal EN is deactivated.

The charge pump 130 pumps charge to a substrate (such as P-wells of a semiconductor memory device) in response to the generated oscillating signal OS. Such charge pumped by the charge pump 130 increases the absolute value of the VBB formed at such a substrate.

The charge pump 130 does not pump charge when the oscillating signal OS is not generated by the oscillator 120. The oscillator 120 and the charge pump130 are individually known to one of ordinary skill in the art and may be implemented with known conventional circuits, and thus a detailed description thereof is omitted.

Figure 5:
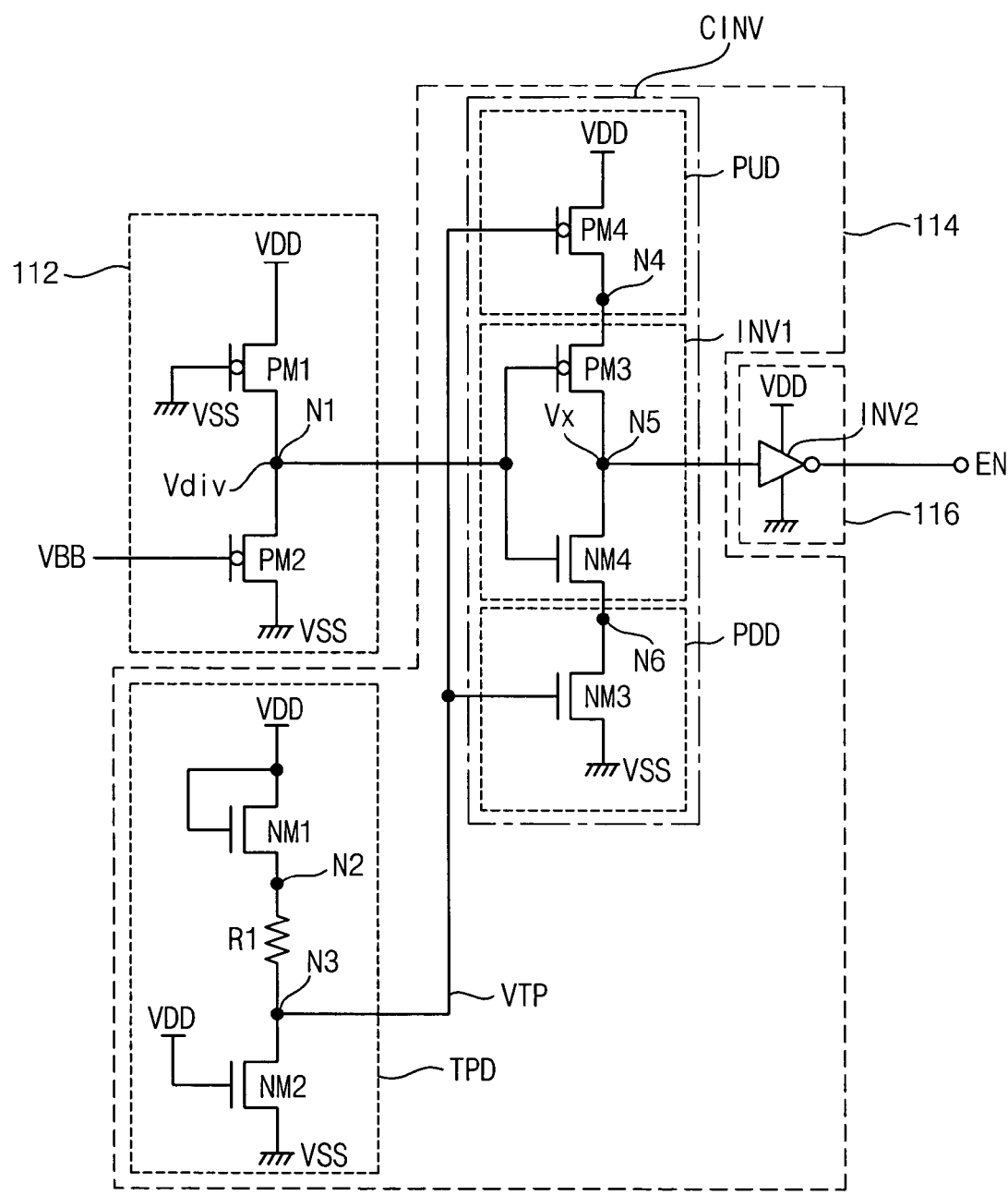
FIG. 5 shows a circuit diagram of a temperature-compensated level detector in the back-bias voltage generator of FIG. 4, according to an example embodiment of the present invention.

FIG. 5 shows a circuit diagram of the temperature-compensated level detector 110 of FIG. 4, according to an example embodiment of the present invention. Referring to FIG. 5, the temperature-compensated level detector 110 includes an input circuit 112, a level indicator 114, and an output circuit 116.

The input circuit 112 is implemented as a voltage divider in one embodiment of the present invention. The voltage divider 112 generates a divided voltage Vdiv based on a ratio of a turn-on resistance of a first PMOSFET (P-channel metal oxide semiconductor field effect transistor) PM1 to a turn-on resistance of a second PMOSFET PM2.

The turn-on resistance of the first PMOSFET PM1 is maintained substantially constant since the gate of the first PMOSFET PM1 is coupled to a ground node. On the other hand, the turn-on resistance of the second PMOSFET PM2 varies depending upon the back-bias voltage VBB that is applied on the gate of the second PMOSFET PM2.

The level indicator 114 includes a temperature detector TPD and a toggling unit which is a controlled CMOS inverter circuit CINV in one embodiment of the present invention. The temperature detector TPD includes a diode-connected NMOSFET (N-channel metal oxide semiconductor field effect transistor) NM1, a resistor R1, and a turned-on NMOSFET NM2, coupled in series with each-other.

The diode-connected NMOSFET NM1 is coupled between a high voltage supply VDD and the resistor R1. The diode-connected NMOSFET NM1 is coupled in series with the resistor R1 at a node N2. The resistor R1 is also coupled to a drain of the turned-on NMOSFET NM2 at a node N3. The turned-on NMOSFET NM2 has a gate coupled to the high voltage supply VDD and has a source coupled to a low voltage supply VSS.

Accordingly, a voltage VN2 generated at the node N2 is expressed by the following Equation 1:

$$VN2 = VDD - VT1. \quad \text{[Equation 1]}$$

VDD is the voltage from the high voltage supply, and VT1 is a threshold voltage of the diode-connected NMOSFET NM1. Thus, VN2 increases in inverse proportion to the threshold voltage VT1 as the temperature is increased.

Additionally, a temperature detecting voltage VTP (i.e., a control bias voltage) generated at the node N3 (i.e., a control bias node) is expressed by the following Equation 2 according to voltage division:

$$VTP = \{1/(1+(R1/Ron2))\} * VN2 \quad \text{[Equation 2]}$$
$$= \{1/(1+(R1/Ron2))\} * (VDD - VT1),$$

Ron2 is a turn-on resistance of the turned-on NMOSFET NM2, and R1 in Equation 2 denotes the resistance of the resistor R1.

As the temperature increases, the turn-on resistance Ron2 of the turned-on NMOSFET NM2 increases such that the value of 1/(1+(R1/Ron2)) increases. In turn, as the temperature increases, both VN2 and Ron2 increase such that the temperature detecting voltage VTP is significantly increased. On the other hand, as the temperature decreases, both VN2 and Ron2 decrease such that the temperature detecting voltage VTP is significantly decreased. In this manner, the temperature detecting voltage VTP has high sensitivity to temperature.

The controlled CMOS inverter circuit CINV as the toggling unit includes a pull up device PUD, a pull down device PDD, and a first CMOS (complementary metal oxide semiconductor) inverter INV1. The pull up device PUD is a PMOSFET PM4 having a source coupled to the high voltage supply VDD and having a gate with the temperature detecting voltage VTP applied thereon. The pull down device PDD is an NMOSFET NM4 having a source coupled to the low voltage supply VSS and having a gate with the temperature detecting voltage VTP applied thereon.

The first CMOS inverter INV1 is connected between a drain of the PMOSFET PM4 and a drain of the NMOSFET NM4. The CMOS inverter INV1 includes a PMOSFET PM3 and an NMOSFET NM4 having gates inputting the divided voltage Vdiv from the input circuit 112. The drains of the PMOSFET PM3 and the NMOSFET NM4 are coupled together to generate a pre-enable signal Vx at node N5. The node N5 is an input of a second CMOS inverter INV2 in the output circuit 116 that generates the enable signal EN provided to the oscillator 120.

The toggling unit CINV causes a toggling of the enable signal EN to be activated to a logic high state when the absolute value of the back-bias voltage VBB is less than an absolute value of a monitoring level. Accordingly, the back-bias voltage VBB generated from the VBB generator 100 is maintained substantially at the monitoring level. The absolute value of such a monitoring level is increased as the temperature increases because the temperature detecting voltage VTP is applied on the gates of both the pull-up PMOSFET PM4 and the pull-down NMOSFET NM3.

Figure 6:
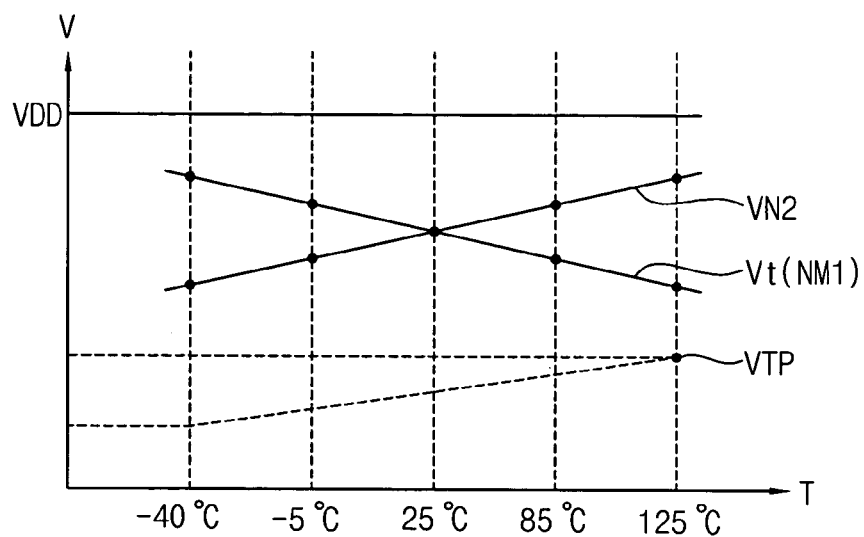
FIG. 6 illustrates graphs of voltages at various temperatures during operation of the temperature-compensated level detector of FIG. 5, according to an example embodiment of the present invention.

FIG. 6 illustrates graphs of voltages VN2, Vt (i.e., VT1), and VTP in the temperature-compensated level detector 110 of FIG. 5 versus temperature. Referring to FIG. 6, the threshold voltage Vt of the NMOSFET NM1 has a negative temperature coefficient such that Vt decreases with increasing temperature. Accordingly, the voltage VN2 at the node N2 increases with temperature. As described earlier, the temperature detecting voltage VTP increases significantly with temperature.

Figure 7:
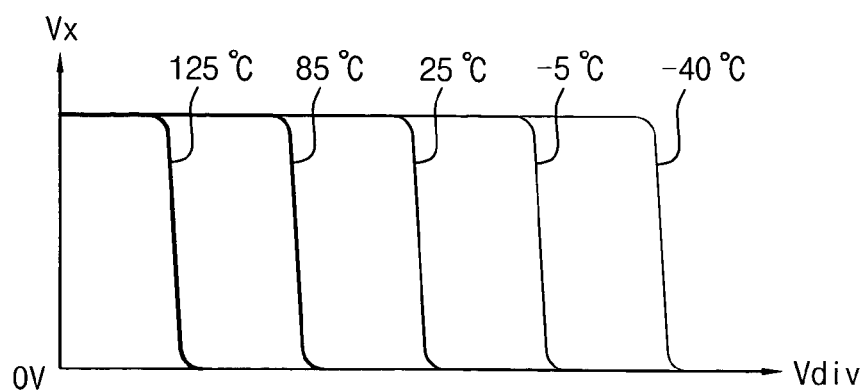
FIG. 7 illustrates graphs of input/output characteristics at various temperatures for a controlled CMOS inverter in FIG. 5, according to an example embodiment of the present invention.

FIG. 7 illustrates graphs of input/output characteristics at various temperatures for the first CMOS inverter INV1 in FIG. 5. Referring to FIGS. 5 and 7, when the VTP voltage is increased with higher temperature, the pull-up current drive capability of the pull up device PM4 is decreased, and the pull-down current drive capability of the pull-down device NM3 is increased.

Accordingly, a logic switching point when the output Vx of the first CMOS inverter INV1 transitions from a logic high state to a logic low state is decreased to a deeper negative value. Thus, the absolute value of the monitoring level is increased as such a logic switching point is changed to a deeper negative value with increased temperature.

On the other hand, when the VTP voltage decreases with lower temperature, the pull-up current drive capability of the pull up device PM4 is increased, and the pull-down current drive capability of the pull-down device NM3 is decreased. Accordingly, a logic switching point when the output Vx of the first CMOS inverter INV1 transitions from a logic high state to a logic low state is increased to a more shallow negative value. Thus, the absolute value of the monitoring level is decreased as such a logic switching point is changed to a shallower negative value with decreased temperature.

Figure 8:
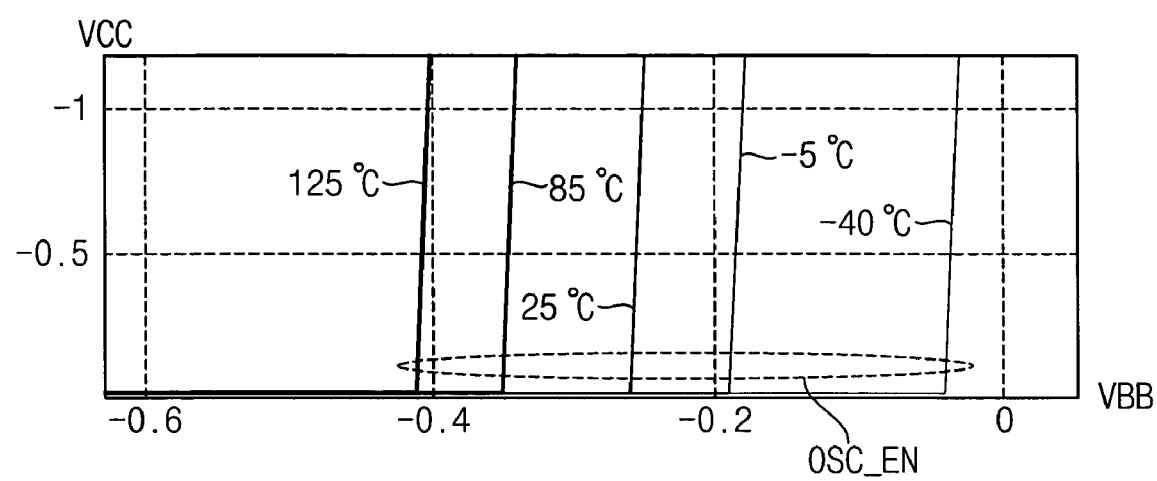
FIG. 8 illustrates waveforms of an enable signal generated at various temperatures by the temperature-compensated level detector of FIG. 5, according to an example embodiment of the present invention.

FIG. 8 illustrates waveforms of the enable signal EN generated at various temperatures by the temperature-compensated level detector 110 of FIG. 5. Referring to FIGS. 5 and 8, the second inverter INV2 generates the enable signal EN (indicated as OSC_EN in FIG. 8) having full CMOS logic voltage level.

Referring to FIGS. 7 and 8, note that the monitoring level is indicated by when the enable signal OSC_EN makes a transition. The monitoring level has a deeper negative value such that the absolute value of the monitoring level increases for higher temperature. Thus, the monitoring level has the highest absolute value at the temperature of about 125° C. and the lowest absolute value at the temperature of about −40° C.

In this manner, the VBB generator 100 of FIG. 4 generates the back-bias voltage VBB that varies with temperature. Such a back-bias voltage VBB has a deeper negative level (and a higher absolute value) as the temperature increases. Such a deeper negative back-bias voltage applied on P-wells of a semiconductor memory device improves refresh characteristics of the semiconductor memory device at higher temperatures. In addition, such a shallower (i.e., lower absolute value) negative back-bias voltage improves the margin of the boosting voltage for driving the word lines of the semiconductor memory device at lower temperatures.

The foregoing is by way of example only and is not intended to be limiting. For example, any voltage values or types of transistor devices illustrated herein are by way of example only. In addition, the signals shown in the timing diagram are by way of example only for describing example operations.

The present invention is limited only as defined in the following claims and equivalents thereof.

What is claimed is:

1. A level detector within a back-bias voltage generator, the level detector comprising:
   a toggling unit that causes an enable signal to be activated when an absolute value of a back-bias voltage is less than an absolute value of a monitoring level; and
   a temperature detector that controls the toggling unit for increasing the absolute value of the monitoring level with an increase in temperature, wherein the toggling unit includes a controlled inverter and pull-up and pull-down devices for biasing the controlled inverter;

and wherein the temperature detector includes:

a diode-connected transistor;

a resistor; and a turned-on transistor coupled in series with the resistor at a control node generating a control bias voltage that increases with the temperature, and wherein the control bias voltage generated at said same one control node is directly applied on gates of the pull up and pull down devices that are field effect transistors;

wherein the diode-connected transistor is coupled in series with the resistor.

2. The level detector of claim 1, wherein the control node is coupled to gates of the pull-up and pull-down devices such that the control bias voltage determines the absolute value of the monitoring level.

3. The level detector of claim 1, wherein the threshold voltage of the diode-connected transistor decreases with the temperature, and wherein the turn-on resistance of the turned-on field effect transistor increases with the temperature.

4. The level detector of claim 1, wherein the toggling unit includes:

the controlled inverter with P-channel and N-channel transistors having drains coupled together to generate a pre-enable signal;

a pull-up transistor that is the pull-up device coupled between a high voltage supply and the P-channel transistor; and a pull-down transistor that is the pull-down device coupled between a low voltage supply and the N-channel transistor;

wherein the control bias voltage is applied on gates of the pull-up and pull-down transistors.

5. The level detector of claim 4, further comprising:

another inverter for inputting the pre-enable signal from the inverter of the toggling unit to generate the enable signal.

6. The level detector of claim 4, further comprising:

a voltage divider for generating a divided voltage that varies with the back-bias voltage, wherein the divided voltage is input by the inverter of the toggling unit.

7. The level detector of claim 6, wherein the voltage divider includes:

a first P-channel field effect transistor having a source coupled to a high voltage supply and having a gate coupled to a ground node; and a second P-channel field effect transistor having a source coupled to a low voltage supply and having a gate with the back-bias voltage applied thereon, wherein the drains of the first and second P-channel field effect transistors are coupled together to generate the divided voltage.

8. A back-bias voltage generator comprising:

a charge pump for pumping charge in response to an oscillating signal to increase an absolute value of a back-bias voltage;

an oscillator that generates the oscillating signal when an enable signal is activated; and a level detector including:

a toggling unit that causes the enable signal to be activated when an absolute value of the back-bias voltage is less than an absolute value of a monitoring level; and a temperature detector that controls the toggling unit for increasing the absolute value of the monitoring level with an increase in temperature, wherein the toggling unit includes a controlled inverter and pull-up and pull-down devices for biasing the controlled inverter;

and wherein the temperature detector includes:

a diode-connected transistor;

a resistor; and a turned-on transistor coupled in series with the resistor at a control node generating a control bias voltage that increases with the temperature, and wherein the control bias voltage generated at said same one control node is directly applied on gates of the pull up and pull down devices that are field effect transistors;

wherein the diode-connected transistor is coupled in series with the resistor.

9. The back-bias voltage generator of claim 8, wherein the control node is coupled to gates of the pull-up and pull-down devices such that the control bias voltage determines the absolute value of the monitoring level.

10. The back-bias voltage generator of claim 8, wherein the threshold voltage of the diode-connected transistor decreases with the temperature, and wherein the turn-on resistance of the turned-on field effect transistor increases with the temperature.

11. The back-bias voltage generator of claim 8, wherein the toggling unit includes:

the controlled inverter with P-channel and N-channel transistors having drains coupled together to generate a pre-enable signal;

a pull-up transistor that is the pull-up device coupled between a high voltage supply and the P-channel transistor; and a pull-down transistor that is the pull-down device coupled between a low voltage supply and the N-channel transistor;

wherein the control bias voltage is applied on gates of the pull-up and pull-down transistors.

12. The back-bias voltage generator of claim 11, wherein the level detector further includes:

another inverter for inputting the pre-enable signal from the inverter of the toggling unit to generate the enable signal.

13. The back-bias voltage generator of claim 11, wherein the level detector further includes:

a voltage divider for generating a divided voltage that varies with the back-bias voltage, wherein the divided voltage is input by the inverter of the toggling unit.

14. The back-bias voltage generator of claim 13, wherein the voltage divider includes:

a first P-channel field effect transistor having a source coupled to a high voltage supply and having a gate coupled to a ground node; and a second P-channel field effect transistor having a source coupled to a low voltage supply and having a gate with the back-bias voltage applied thereon, wherein the drains of the first and second P-channel field effect transistors are coupled together to generate the divided voltage.

15. The back-bias voltage generator of claim 8, wherein the back-bias voltage is generated at a substrate of a semiconductor memory device.

* * * * *